United States Patent
Katoch (10) Patent No.: US 9,324,415 B2
(45) Date of Patent: Apr. 26, 2016

(54) CLAMPING CIRCUIT FOR MULTIPLE-PORT MEMORY CELL

(71) Applicant: TAIWAN SEMICONDUCTOR MANUFACTURING COMPANY, LTD., Hsinchu (TW)

(72) Inventor: Atul Katoch, Kanata (CA)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 40 days.

(21) Appl. No.: 14/178,452

(22) Filed: Feb. 12, 2014

(65) Prior Publication Data
US 2015/0228331 A1 Aug. 13, 2015

(51) Int. Cl.
| G11C 15/00 | (2006.01) |
| G11C 11/419 | (2006.01) |
| G11C 8/16 | (2006.01) |
| G11C 11/412 | (2006.01) |

(52) U.S. Cl.
CPC ............. *G11C 11/419* (2013.01); *G11C 8/16* (2013.01); *G11C 11/412* (2013.01)

(58) Field of Classification Search
CPC ........................................ G11C 15/00
USPC ........................................... 365/154
See application file for complete search history.

(56) References Cited

U.S. PATENT DOCUMENTS

| 7,689,941 | B1 * | 3/2010 | Ooi et al. ............... 716/133 |
| 2010/0315859 | A1 * | 12/2010 | Lee ......................... 365/154 |
| 2011/0305072 | A1 * | 12/2011 | Ishii et al. ................ 365/154 |
| 2013/0194882 | A1 * | 8/2013 | Ishii et al. ................ 365/194 |
| 2013/0258761 | A1 * | 10/2013 | Sharpe-Geisler et al. .... 365/154 |

* cited by examiner

*Primary Examiner* — Min Huang
(74) *Attorney, Agent, or Firm* — Hauptman Ham, LLP (57) ABSTRACT

A circuit includes a memory cell, a first data line, a second data line, and a clamping unit. The memory cell includes a data node, a first pass gate, and a second pass gate. The first pass gate is between the first data line and the data node. The second pass gate is between the second data line and the data node. The clamping unit is electrically coupled to the first data line and configured to pull a voltage level of the first data line toward a clamped voltage level when the clamping unit is enabled, and to function as an open circuit to the first data line when the clamping unit is disabled. The clamping unit is disabled when a first control signal indicates that a voltage level of the second data line is pulled toward a reference voltage level.

20 Claims, 6 Drawing Sheets

FIG. 6

CLAMPING CIRCUIT FOR MULTIPLE-PORT MEMORY CELL

BACKGROUND

A multiple-port memory cell, such as a dual-port memory cell, includes at least two access ports. Each access port includes a data line or a pair of data lines configured to carry the data read from or written into the memory cell. In various situations, the data lines of both access ports are kept at a logical high voltage level by corresponding clamping circuits. In some configurations, the clamping circuits are introduced to reduce the disturbance to the memory cell when either of the access ports is under a dummy read operation. A dummy read operation occurs to a particular memory cell when the memory cell is not being accessed, but various signals cause the memory cell to be in a read-like condition, such as when a word line is activated to access another memory cell of the same row.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for simplicity and clarity and does not in itself dictate a relationship between the various embodiments and/or configurations discussed.

In some embodiments of the present disclosure, a dual-port memory cell has data lines and clamping units variously associated with a first access port and a second access port. A clamping unit of the data line of the first port is disabled when the data line of the second port is pulled toward a voltage level during a write operation along a direction opposite to the driving direction of the clamping unit. As such, a contention caused by the clamping unit is avoided.

Figure 1:
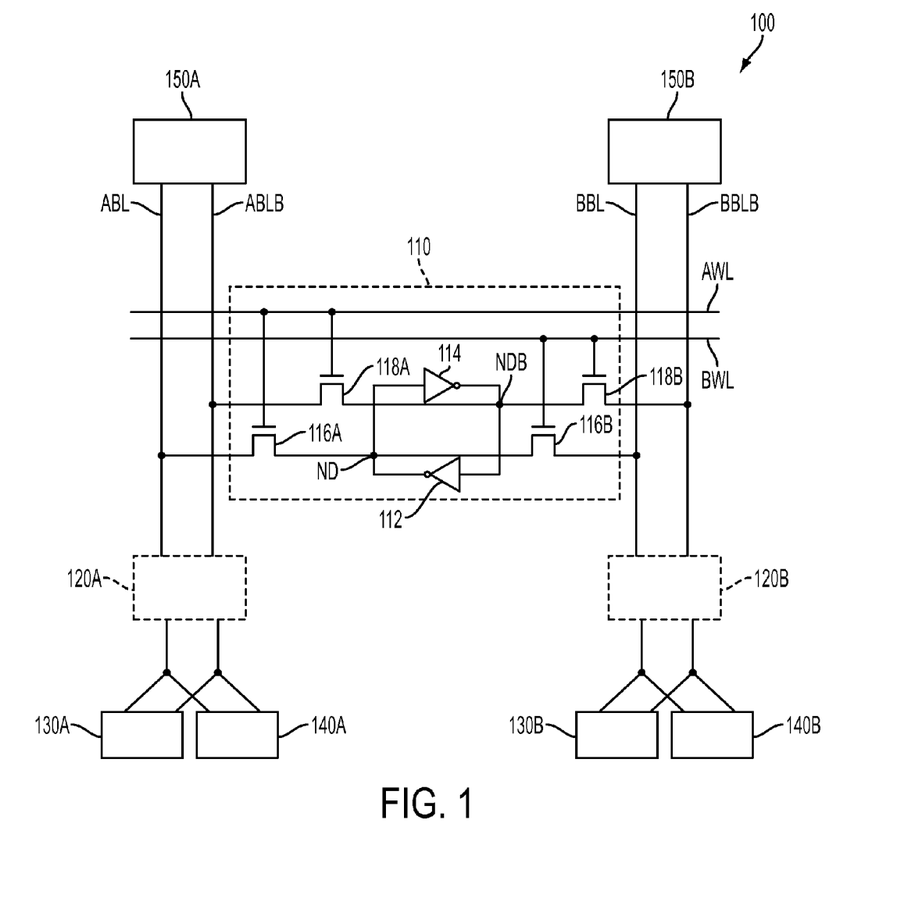
FIG. 1 is a diagram of a portion of a memory circuit in accordance with some embodiments.

FIG. 1 is a diagram of a portion of a memory circuit 100 in accordance with some embodiments. Memory circuit 100 includes a memory cell 110, data lines ABL, ABLB, BBL, and BBLB, multiplexers 120A and 120B, sense amplifiers 130A and 130B, write drivers 140A and 140B, and clamping circuits 150A and 150B.

Memory cell 110 includes a first inverter 112, a second inverter 114, and pass gates 116A, 116B, 118A, and 118B. An output terminal of inverter 112 is electrically coupled with an input terminal of inverter 114 at node ND. An output terminal of inverter 114 is electrically coupled with an input terminal of inverter 112 at node NDB. Inverters 112 and 114 are configured to store a logic value and a complementary logic value at nodes ND and NDB. In some embodiments, memory cell 110 is configured as a static random access memory (SRAM) cell. In some embodiments, memory cell 110 is replaced with a memory cell other than an SRAM cell, such as a dynamic random access memory (DRAM) cell or a non-volatile memory cell.

Pass gate 116A is between data line ABL and node ND, and pass gate 118A is between data line ABLB and node NDB. In FIG. 1, pass gates 116A and 118A are N-type transistors having gate terminals connected to word line AWL. In some embodiments, pass gates 116A and 118A are P-type transistors or transmission gates. Pass gate 116A and pass gate 118A are controlled by a word line signal S.AWL (not labeled) on word line AWL. When word line signal S.AWL is activated to turn on pass gate 116A and pass gate 118A, node ND is electrically coupled with data line ABL, and node NDB is electrically coupled with data line ABLB. Accordingly, sense amplifier 130A and write driver 140A are capable of accessing node ND and node NDB through pass gate 116A and pass gate 118A when word line AWL is activated.

Pass gate 116B is between data line BBL and node ND, and pass gate 118B is between data line BBLB and node NDB. In FIG. 1, pass gates 116B and 118B are N-type transistors having gate terminals connected to word line BWL. In some embodiments, pass gates 116B and 118B are P-type transistors or transmission gates. Pass gate 116B and pass gate 118B are controlled by a word line signal S.BWL (not labeled) on word line BWL. When word line signal S.BWL is activated to turn on pass gate 116B and pass gate 118B, node ND is electrically coupled with data line BBL, and node NDB is electrically coupled with data line BBLB. Accordingly, sense amplifier 130B and write driver 140B are capable of accessing node ND and node NDB through pass gate 116B and pass gate 118B when word line BWL is activated.

Memory cell 110 is also known to have a dual-port configuration. Pass gates 116A and 118A constitute a first access port of memory cell 110 for reading data from, or writing data to, node ND and node NDB through data lines ABL and ABLB. Pass gates 116B and 118B constitute a second access port of memory cell 110 for reading data from, or writing data to, node ND and node NDB through data lines BBL and BBLB.

Only one memory cell 110 is depicted in FIG. 1. In some embodiments, memory circuit 100 includes a plurality of memory cells each having a configuration similar to that of memory cell 110. The plurality of memory cells are arranged into rows and columns. Memory cells that are in the same column as memory cell 110 have pass gates corresponding to pass gate 116A and 118A coupled to data lines ABL and ABLB and pass gates corresponding to pass gate 116B and 118B coupled to data lines BBL and BBLB. Memory cells that are on the same row as memory cell 110 have pass gates corresponding to pass gate 116A and 118A controlled by word line signal S.AWL and pass gates corresponding to pass gate 116B and 118B controlled by word line signal S.BWL.

Multiplexer 120A is electrically coupled to a plurality of columns of memory cells through data lines ABL and ABLB and counterpart data lines of one or more other columns of the plurality of columns of memory cells. Multiplexer 120A is also electrically coupled to sense amplifier 130A and write driver 140A. In some embodiments, the plurality of columns of memory cells associated with multiplexer 120A includes four (4) to sixteen (16) columns. Sense amplifier 130A and write driver 140A are shared by the plurality of columns of memory cells through multiplexer 120A. Multiplexer 120A is configured to electrically couple a corresponding pair of data lines of one of the plurality of columns of memory cells to sense amplifier 130A and/or write driver 140A based on a set of control signals.

Multiplexer 120B is electrically coupled to the same plurality of columns of memory cells that are also coupled to multiplexer 120A. Multiplexer 120B is electrically coupled to the corresponding columns of memory cells through data lines BBL and BBLB and counterpart data lines of one or more other columns of the plurality of columns of memory cells. Multiplexer 120B is also electrically coupled to sense amplifier 130B and write driver 140B. Sense amplifier 130B and write driver 140B are shared by the plurality of columns of memory cells through multiplexer 120B. Multiplexer 120B is configured to electrically couple a corresponding pair of data lines of one of the plurality of columns of memory cells to sense amplifier 130B and/or write driver 140B based on another set of control signals.

In some embodiments, electrical components for selecting corresponding data lines for sense amplifier 130A and write driver 140A are integrally formed within sense amplifier 130A and write driver 140A, and a separate multiplexer 120A is thus omitted. In some embodiments, sense amplifier 130A and write driver 140A are only for accessing the column that memory cell 110 belongs, and multiplexer 120A is omitted. In some embodiments, a separate multiplexer 120B is omitted under the conditions similar to those for multiplexer 120A addressed above.

Clamping circuit 150A is configured to pull a voltage level of data line ABL and/or a voltage level of data line ABLB toward a clamped voltage level, or to function as an open circuit to data line ABL and/or data line ABLB. In some embodiments, the clamped voltage level corresponds to a logical high level. In some embodiments, the clamped voltage level equals a supply voltage level. Clamping circuit 150B is configured to pull a voltage level of data line BBL and/or a voltage level of data line BBLB toward the clamped voltage level, or to function as an open circuit to data line BBL and/or data line BBLB. Configurations and operations of clamping circuits 150A and 150B will be further described below.

Figure 2A:
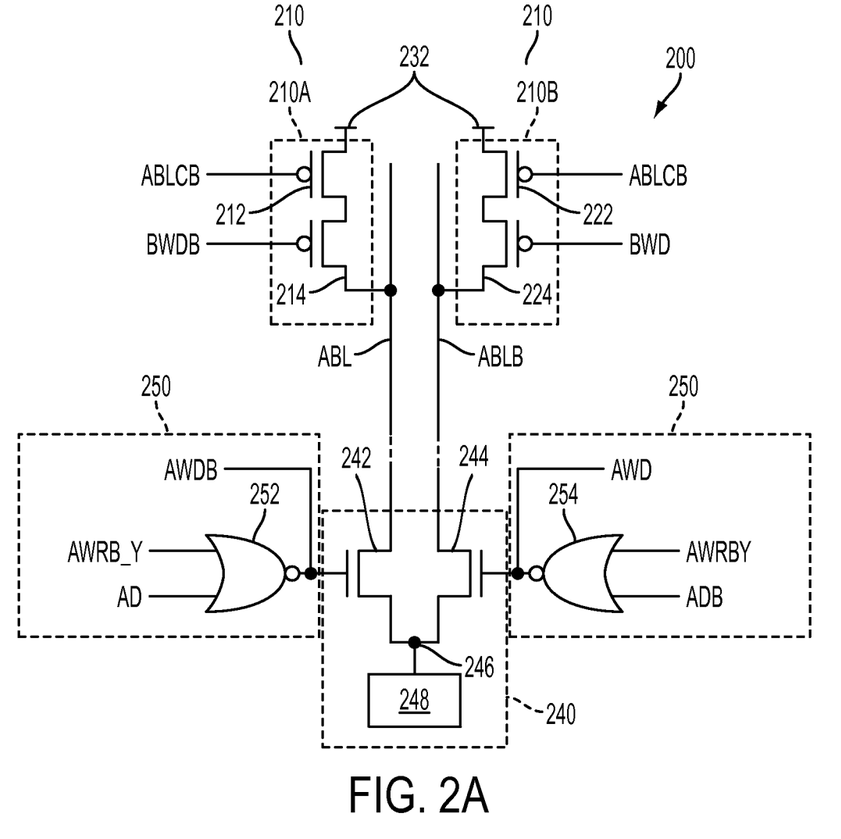
FIG. 2A is a diagram of a portion of a memory circuit, including a clamping circuit and a write driver, in accordance with some embodiments.

FIG. 2A is a diagram of a portion 200 of a memory circuit, including a clamping circuit 210 and a write driver 240, in accordance with some embodiments. In some embodiments, clamping circuit 210 that includes clamping units 210A and 210B is usable as a clamping circuit in a memory circuit, such as clamping circuit 150A in FIG. 1. In some embodiments, write driver 240 is usable as a write driver in a memory circuit, such as write driver 140A. Components in FIG. 2A that are the same or similar to those in FIG. 1 are given the same reference numbers, and a detailed description thereof is omitted. Clamping circuit 150B and write driver 140B are further illustrated in conjunction with FIG. 3A.

Clamping circuit 210 includes two clamping units 210A and 210B. Clamping unit 210A is electrically coupled with data line ABL and a power supply node 232. Clamping unit 210A is configured to pull a voltage level of data line ABL toward a clamping voltage level when clamping unit 210A is enabled, and to function as an open circuit to data line ABL when clamping unit 210A is disabled. Clamping unit 210B is configured to pull a voltage level of data line ABLB toward the clamped voltage level when clamping unit 210B is enabled, and to function as an open circuit to data line ABLB when clamping unit 210B is disabled.

Clamping unit 210A includes two P-type transistors 212 and 214. Source terminal of transistor 212 is coupled with power supply node 232. Drain terminal of transistor 212 is coupled with source terminal of transistor 214. Drain terminal of transistor 214 is coupled with data line ABL. Gate of transistor 212 is configured to receive a control signal ABLCB. Control signal ABLCB is set to have the logical high level to turn off transistor 212 when data line ABL and data line ABLB are selected to be used for performing a read operation or a write operation. In some embodiments, control signal ABLCB is set to have a logical low level to turn on transistor 212 when data line ABL and data line ABLB are not selected to be used for performing a read operation or a write operation.

Gate of transistor 214 is configured to receive another control signal BWDB. When both transistors 212 and 214 are turned on, clamping unit 210A is enabled and capable of pulling the voltage level of data line ABL towards a clamped voltage level, such as a supply voltage level at power supply node 232 coupled with the source of transistor 212. Control signal BWDB is set to have the logical low level to turn off transistor 214 when data line BBL in FIG. 1 is selected to be used for performing a write operation, and when a write data signal indicates that a logic value for the write operation of data line BBL is a logical low value.

As a result, in some embodiments, clamping unit 210A for data line ABL is configured to be disabled responsive to control signal BWDB indicating that the voltage level of data line BBL is being pulled toward a reference voltage level that corresponds to the logical low level and is different from the clamped voltage level. In some embodiments, the reference voltage level is lower than the clamped voltage level.

Clamping unit 210B includes two P-type transistors 222 and 224. Source terminal of transistor 222 is coupled with power supply node 232. Drain terminal of transistor 222 is coupled with source terminal of transistor 214. Drain terminal of transistor 224 is coupled with data line ABLB. Gate of transistor 222 is also configured to receive and to be controlled by control signal ABLCB. Control signal ABLCB thus is used to turn on or turn off transistors 212 and 222 at the same time.

Gate of transistor 224 is configured to receive another control signal BWD. When both transistors 222 and 224 are turned on, clamping unit 210B is enabled and capable of pulling the voltage level of data line ABLB towards the clamped voltage level. Control signal BWD is set to have the logical low level to turn off transistor 224 when data line BBLB is selected to be used for performing a write operation, and when a write data signal indicates that a logic value for the write operation of data line BBLB is a logical low value.

As a result, in some embodiments, clamping unit 210B for data line ABLB is configured to be disabled responsive to control signal BWD indicating that the voltage level of data line BBLB is being pulled toward the reference voltage level.

In some embodiments, transistors 214 and 224 are not turned off at the same time. In some embodiments, control signal BWD and control signal BWDB are not set to have the logical high level concurrently.

Figure 3A:
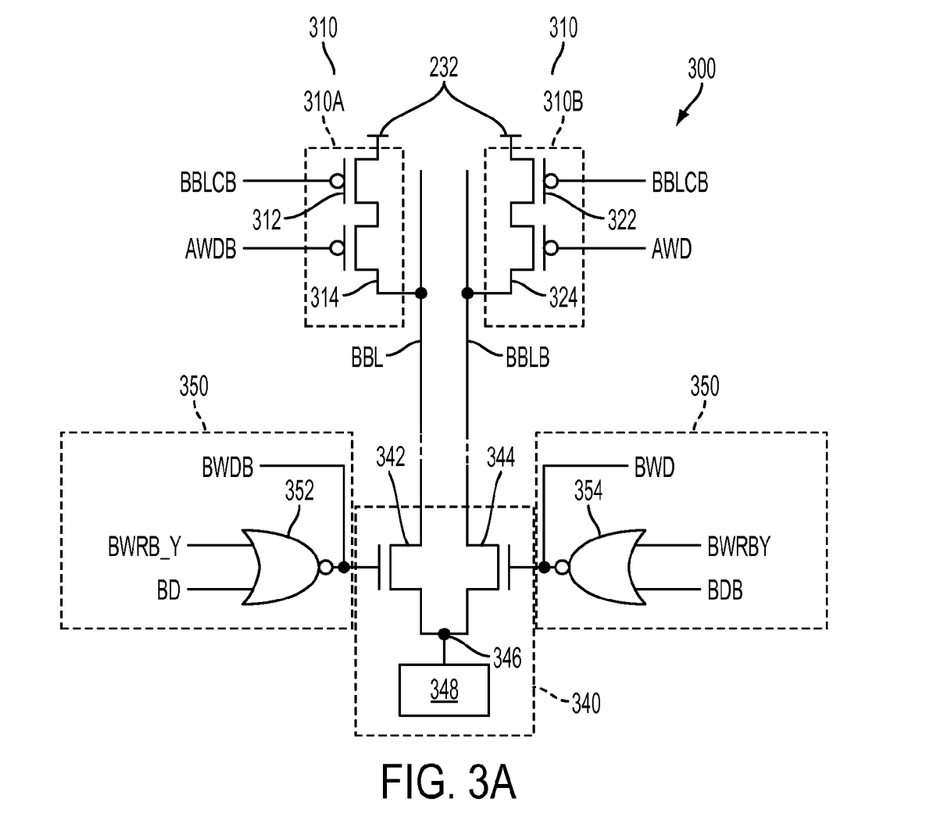
FIG. 3A is a diagram of another portion of the memory circuit, including a clamping circuit and a write driver in accordance with some embodiments.

The generation of control signals BWD and BWDB are further illustrated in conjunction with FIG. 3A.

In some embodiments, some or all of transistors 212, 214, 222, and 224 are N-type transistors, and corresponding control signals are set to cause on/off of transistors 212, 214, 222, and 224 in a manner similar to the circuit in FIG. 2A. In some embodiments when some or all of transistors 212 212, 214, 222, and 224 are N-type transistors, the clamped voltage is lower than the supply voltage level at power supply node 232. In some embodiments, when some or all of transistors 212 212, 214, 222, and 224 are N-type transistors, the corresponding clamped voltage is the supply voltage level minus a threshold voltage of N-type transistors 212 212, 214, 222, or 224.

Write driver 240 includes two N-type transistors 242 and 244, and a write assist unit 248. Sources of transistors 242 and 244 are coupled together to form a reference node 246. Write assist unit 248 is coupled to reference node 246 and is configured to adjust a voltage level at reference node 246 for various operations of the memory circuit 100. Drain of transistor 242 is coupled to data line ABL, and gate of transistor 242 is configured to receive a control signal AWDB. Drain of transistor 244 is coupled to data line ABLB, and gate of transistor 244 is configured to receive a control signal AWD. In some embodiments, other circuits usable as write driver 240 are within the scope of the disclosure.

A logic unit 250 is configured to generate control signals AWDB and AWD for write driver 240 and clamping circuit 300 in FIG. 3A. Logic unit 250 includes NOR gates 252 and 254. NOR gate 252 is configured to generate signal AWDB by performing a NOR operation on signal AWRB_Y and signal AD. Signal AWRB_Y is a write column selection signal indicating that data line ABL and data line ABLB are being selected for performing a write operation. Signal AD is a write data signal indicating a logic value for the write operation on data line ABL. NOR gate 254 is configured to generate signal AWD by performing a NOR operation on signal AWRB_Y and signal ADB. Signal ADB is a write data signal indicating a logic value for the write operation on data line ABLB. In some embodiments, signal ADB is a logically complementary to signal AD. In some embodiments, other circuits generating signals AWD and AWDB are within the scope of the disclosure.

When data lines ABL and ABLB are selected for performing a write operation, data lines ABL and ABLB are precharged to a voltage level corresponding to the logical high level. One of control signal AWD and AWDB is set to have the high logical value, and the other one of control signal AWD and AWDB is set to have the low logical value. As such, one of transistor 242 and 244 is turned on responsive to the high logical value at the corresponding gate to pull data line ABL or ABLB toward a voltage level at reference node 246 that corresponds to the logical low level. The other one of transistor 242 and 244 is turned off responsive to the low logical value at the corresponding gate to electrically decouple data line ABL or ABLB from reference node 246.

Figure 2B:
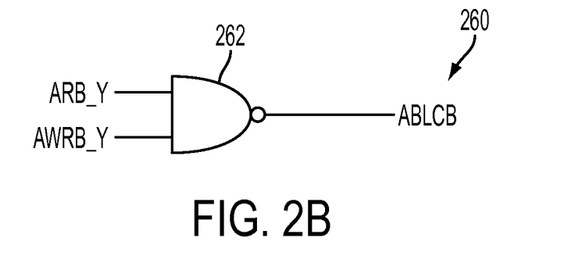
FIG. 2B is a diagram of a logic unit for generating a control signal for the clamping circuit in FIG. 2A in accordance with some embodiments.

FIG. 2B is a diagram of a logic unit 260 for generating control signal ABLCB for the clamping circuit 200A in FIG. 2A in accordance with some embodiments. Logic unit 260 includes a NAND gate 262. NAND gate 262 is configured to generate signal ABLCB by performing a NAND operation on signal ARB_Y and signal AWRB_Y. Signal ARB_Y is a read column selection signal indicating that data line ABL and data line ABLB are being selected for performing a read operation. In some embodiments, other circuits generating signal ABLCB are within the scope of the disclosure.

FIG. 3A is a diagram of another portion 300 of the memory circuit, including a clamping circuit 310 and a write driver 340, in accordance with some embodiments. In some embodiments, clamping circuit 310 that includes clamping units 310A and 310B is usable as a clamping circuit in a memory circuit, such as clamping circuit 150B in FIG. 1. In some embodiments, write driver 340 is usable as a write driver in a memory circuit, such as write driver 140B in FIG. 1. Components in FIG. 3A that are the same or similar to those in FIG. 1 and FIGS. 2A-2B are given the same reference numbers, and detailed description thereof are omitted.

Clamping circuit 310 includes two clamping units 310A and 310B. Clamping unit 310A is electrically coupled with data line BBL and a power supply node 232. Clamping unit 310A is configured to pull a voltage level of data line BBL toward a clamped voltage level when clamping unit 310A is enabled, and to function as an open circuit to data line BBL when clamping unit 310A is disabled. Clamping unit 310B is configured to pull a voltage level of data line BBLB toward the clamped voltage level when clamping unit 310B is enabled, and to function as an open circuit to data line BBLB when clamping unit 310B is disabled.

Clamping unit 310A includes two P-type transistors 312 and 314. Source terminal of transistor 312 is coupled with power supply node 232. Drain terminal of transistor 312 is coupled with source terminal of transistor 314. Drain terminal of transistor 314 is coupled with data line BBL. Gate of transistor 312 is configured to receive a control signal BBLCB. Gate of transistor 314 is configured to receive another control signal AWDB. Control signal BBLCB for clamping circuit 310 corresponds to control signal ABLCB in FIG. 2A and is set to have the logical high level to turn off transistor 312 when data line BBL and data line BBLB are selected to be used for performing a read operation or a write operation.

Clamping unit 310B includes two P-type transistors 322 and 324. Source terminal of transistor 322 is coupled with power supply node 232. Drain terminal of transistor 322 is coupled with source terminal of transistor 324. Drain terminal of transistor 324 is coupled with data line BBLB. Gate of transistor 322 is also configured to receive and to be controlled by control signal BBLCB. Control signal BBLCB thus is used to turn on or turn off transistors 312 and 322 at the same time. Gate of transistor 324 is configured to receive another control signal AWD.

Clamping units 310A and 310B are configured in a manner similar to the configuration of clamping units 210A and 210B, except clamping units 310A and 310B are for data lines BBL and BBLB based on a write column selection signal and a write data signal associated with data lines ABL and ABLB. In some embodiments, clamping unit 310A for data line BBL is configured to be disabled responsive to control signal AWDB indicating that the voltage level of data line ABL is being pulled toward the reference voltage level. Also, in some embodiments, clamping unit 310B for data line BBLB is configured to be disabled responsive to control signal AWD indicating that the voltage level of data line ABLB is being pulled toward the reference voltage level. In some embodiments, other circuits generating signals BWD and BWDB are within the scope of the disclosure.

Write driver 340 includes two N-type transistors 342 and 344, and a write assist unit 348. Sources of transistors 342 and 344 are coupled together to form a reference node 346. Write assist unit 348 is coupled to reference node 346 and is configured to adjust a voltage level at reference node 346 for various operations of the memory circuit 100. Drain of transistor 342 is coupled to data line BBL, and gate of transistor 342 is configured to receive a control signal BWDB. Drain of transistor 344 is coupled to data line BBLB, and gate of transistor 344 is configured to receive a control signal BWD. In some embodiments, other circuits usable as write driver 340 are within the scope of the disclosure.

A logic unit 350 is configured to generate control signals BWDB and BWD for write driver 340 and clamping circuit 210 in FIG. 2A in accordance with some embodiments. Logic unit 350 includes NOR gates 352 and 354. NOR gate 352 is configured to generate signal BWDB by performing a NOR operation on signal BWRB_Y and signal BD. Signal BWRB_Y is a write column selection signal indicating that data line BBL and data line BBLB are being selected for performing a write operation. Signal BD is a write data signal indicating a logic value for the write operation on data line BBL. NOR gate 354 is configured to generate signal BWD by performing a NOR operation on signal BWRB_Y and signal BDB. Signal BDB is a write data signal indicating a logic value for the write operation on data line BBLB. In some embodiments, signal BDB is a logically complementary to signal BD.

When data lines BBL and BBLB are selected for performing a write operation, data lines BBL and BBLB are precharged to a voltage level corresponding to the logical high level. One of control signal BWD and BWDB is set to have the high logical value, and the other one of control signal BWD and BWDB is set to have the low logical value. As such, one of transistor 342 and 344 is turned on responsive to the high logical value at the corresponding gate to pull data line BBL or BBLB toward a voltage level at reference node 346 that corresponds to the logical low level. The other one of transistor 342 and 344 is turned off responsive to the low logical value at the corresponding gate to electrically decouple data line BBL or BBLB from reference node 346.

Figure 3B:
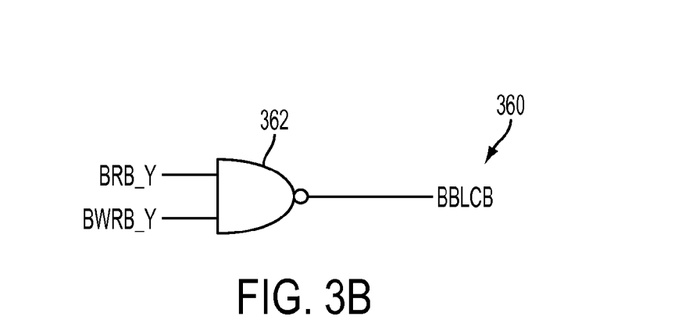
FIG. 3B is a diagram of a logic unit for generating a control signal for the clamping circuit in FIG. 3A in accordance with some embodiments.

FIG. 3B is a diagram of a logic unit 360 for generating control signal BBLCB for the clamping circuit 310 in FIG. 3A in accordance with some embodiments. Logic unit 360 includes a NAND gate 362. NAND gate 362 is configured to generate signal BBLCB by performing a NAND operation on signal BRB_Y and signal BWRB_Y. Signal BRB_Y is a read column selection signal indicating that data line BBL and data line BBLB are being selected for performing a read operation. In some embodiments, other circuits generating signal BBLCB are within the scope of the disclosure.

Figure 4:
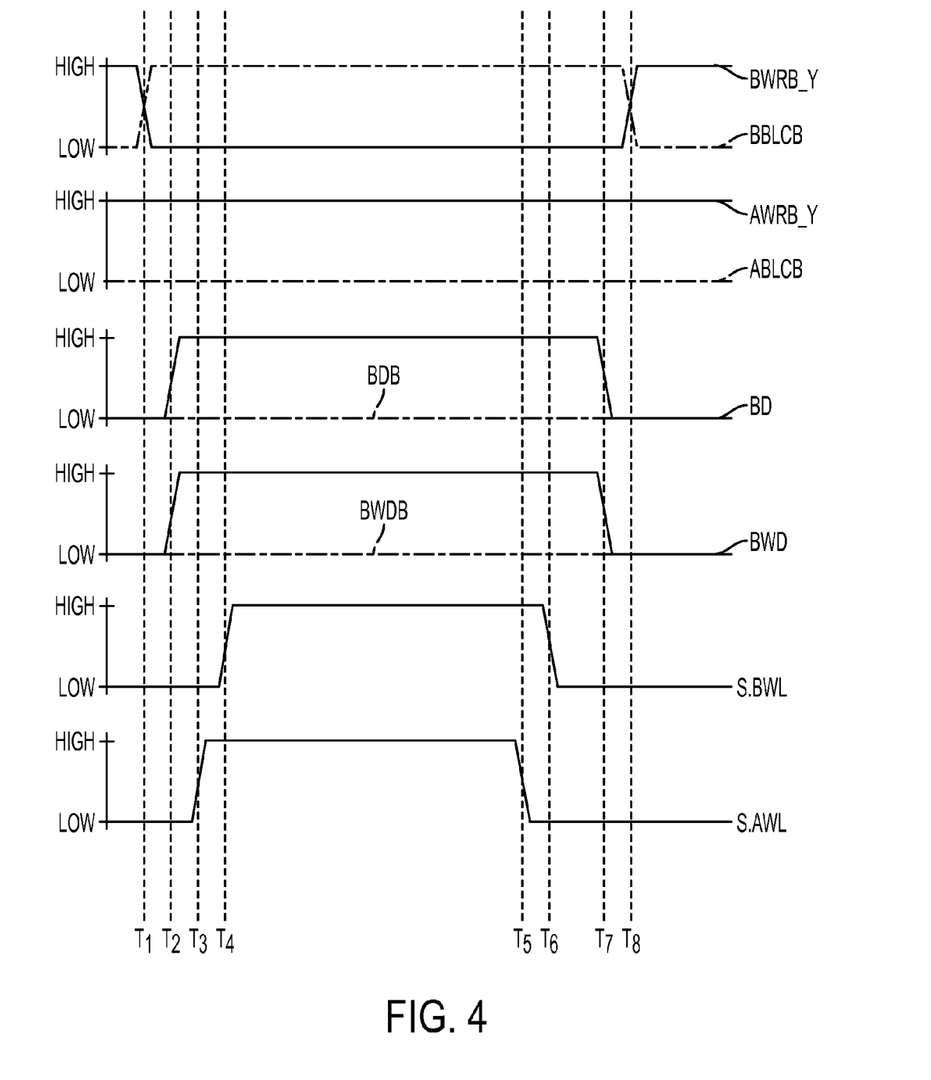
FIG. 4 is a graph of waveforms of various signals of the circuit in FIGS. 1 and 2A-3B in accordance with some embodiments.

FIG. 4 is a graph of waveforms of various signals of the circuit in FIGS. 1 and 2A-3B in accordance with some embodiments.

At time $T_1$, signal BWRB_Y transitions from the logical high level to the logical low level indicating that data lines BBL and BBLB are selected for a write operation. Logic unit 360 causes signal BBLCB to transition from the logical low level to the logical high level and thus turns off transistors 312 and 322. As a result, clamping units 310A and 310B are disabled. Signal AWRB_Y remains at the logical high level, and signal ABLCB thus remains at the logical low level, which turns on transistors 212 and 222.

At time $T_2$, data signal BD transitions from the logical low level to the logical high level indicating that a logical high value is going to be written into memory cell 110 through data line BBL, and a logical low value is going to be written into memory cell 110 through data line BBLB. Logic unit 350 causes signal BWD to transition from the logical low level to the logical high level and signal BWDB to remain at the logical low level. Therefore, transistor 214 is turned on and transistor 224 is turned off. As a result, clamping unit 210B is disabled, and clamping unit 210A remains enabled.

At time $T_3$, word line signal S.AWL on word line AWL transitions from low logical level to high logical level. In this particular example, a memory cell other than memory cell 110 is being accessed based on the same word line signal S.AWL. Although data lines ABL and ABLB of memory cell 110 are not selected to be used to access memory cell 110, pass gate 116A and pass gate 118A are still turned on by word line signal S.AWL. Node ND is electrically coupled to data line ABL through pass gate 116A, and node NDB is electrically coupled to data line ABLB through pass gate 118A. As a result, access port constituted by data lines ABL and ABLB is under a dummy read operation. Clamping unit 210B is disabled based on control signal BWD and thus functions as an open circuit to data line ABLB. On the other hand, clamping unit 210A remains enabled and pulls a voltage level at data line ABL toward the clamped voltage level.

At time $T_4$, word line signal S.BWL on word line BWL transitions from the logical low level to the logical high level. In this particular example, data lines BBL and BBLB are selected to be used to write data into memory cell 110. Pass gate 116B and pass gate 118B are turned on. Node ND is electrically coupled to data line BBL through pass gate 116B, and node NDB is electrically coupled to data line BBLB through pass gate 118B. Clamping unit 310A and clamping unit 310B are disabled based on control signal BBLCB and thus function as an open circuit to data line BBL and data line BBLB.

After word line signal S.BWL is set at high logical level, multiplexer 120B and write driver 140B are configured to write data into memory cell 110 through access port constituted by data lines BBL and BBLB based on data signals BD and BDB. As such, during a time period between time $T_4$ and time $T_5$, data line BBLB is pulled, by write driver 140B, toward a reference voltage level representing low logical level. In some embodiments, the reference voltage level is lower than the clamped voltage level. Also, during the time period between time $T_4$ and time $T_5$, data line BBL is pulled, by write driver 140B, toward the clamped voltage level or a power supply voltage level representing high logical level.

In some other configurations, clamping units are not disabled responsive to write data signals, and thus a write driver is responsible for both fighting against the contention caused by a corresponding clamping circuits and pulling the voltage level of a corresponding bit line. Compared with such other configurations, clamping unit 210B of the present disclosure is disabled based on control signal BWD. Thus, write driver 140B pulls the voltage level of data line BBLB toward the reference voltage level without driving contention caused by clamping unit 210B. As a result, memory circuit 100 has a faster write speed. Also, compared with a counterpart circuit that has the contention between write drivers and clamping circuits, slower transistors or smaller transistors are capable of forming clamping circuits 150A/150B and/or write drivers 140A/140B of the present disclosure yet still achieve the same write speed.

At time $T_5$, word line signal S.AWL on word line AWL transitions from high logical level to low logical level. The dummy read operation observed on data lines ABL and ABLB is therefore concluded.

At time T₆, word line signal S.BWL on word line BWL transitions from high logical level to low logical level to conclude the write operation through data lines BBL and BBLB.

At time T₇, data signals BD and BDB are reset to a reset voltage level, such as the reference voltage level representing low logical level.

At time T₈, signal BWRB_Y transitions from low logical level to high logical level indicating that data lines BBL and BBLB are no longer selected for accessing memory cell 110. Logic unit 360 causes signal BBLCB transitioning from high logical level to low logical level and thus turns on transistors 312 and 322.

The embodiments illustrated in conjunction with FIGS. 1 to 4 are based on a configuration that each access port has a pair of complementary data lines. The same principles described above are also applicable to a configuration that each access port has a single data line.

Figure 5:
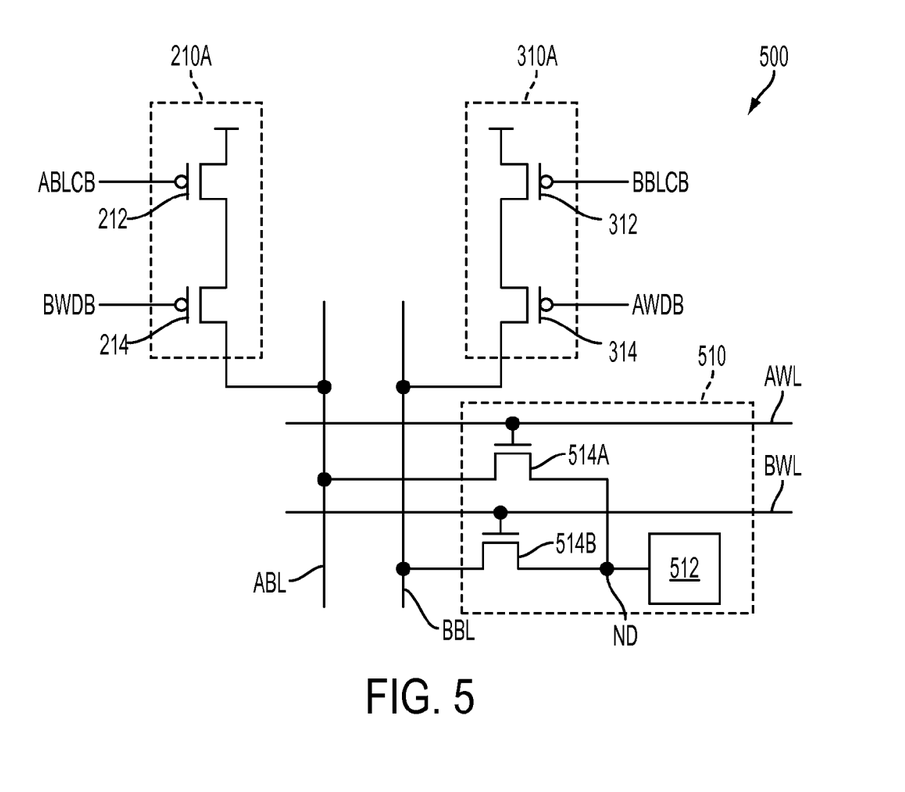
FIG. 5 is a diagram of a portion of another memory circuit in accordance with some embodiments.

FIG. 5 is a diagram of a portion of another memory circuit 500 in accordance with some embodiments. Components in FIG. 5 that are the same or similar to those in FIG. 1 and FIGS. 2A-3B are given the same reference numbers, and detailed descriptions thereof are omitted.

Memory circuit 500 includes a memory cell 510, data lines ABL and BBL, and clamping units 210A and 310A coupled with data lines ABL and BBL, respectively. Memory cell 510 includes a data node ND, a storage unit 512, and pass gates 514A and 514B. Storage unit 512 is coupled with data node ND. Pass gate 514A is between data line ABL and node ND. In FIG. 5, pass gate 514A is an N-type transistor having a gate terminal connected to word line AWL. Pass gate 514B is between data line BBL and node ND. In FIG. 5, pass gate 514B is an N-type transistor having a gate terminal connected to word line BWL. In some embodiments, memory cell 510 is a SRAM cell, a DRAM cell, or a non-volatile memory cell.

Compared with memory circuit 100, each port of memory circuit 500 utilizes one data line ABL or BBL. Clamping unit 210A is configured to pull a voltage level of data line ABL toward a clamped voltage level when clamping unit 210A is enabled, and to function as an open circuit to data line ABL when clamping unit 210A is disabled. In some embodiments, clamping unit 210A is disabled responsive to control signal BWDB indicating that a voltage level of data line BBL is being pulled toward a reference voltage level corresponding to a low logical level. Clamping unit 310A is configured to pull a voltage level of data line BBL toward the clamped voltage level when clamping unit 310A is enabled, and to function as an open circuit to data line BBL when clamping unit 310A is disabled. In some embodiments, clamping unit 310A is disabled responsive to control signal AWDB indicating that the voltage level of data line BBL is being pulled toward a reference voltage level corresponding to a low logical level.

Figure 6:
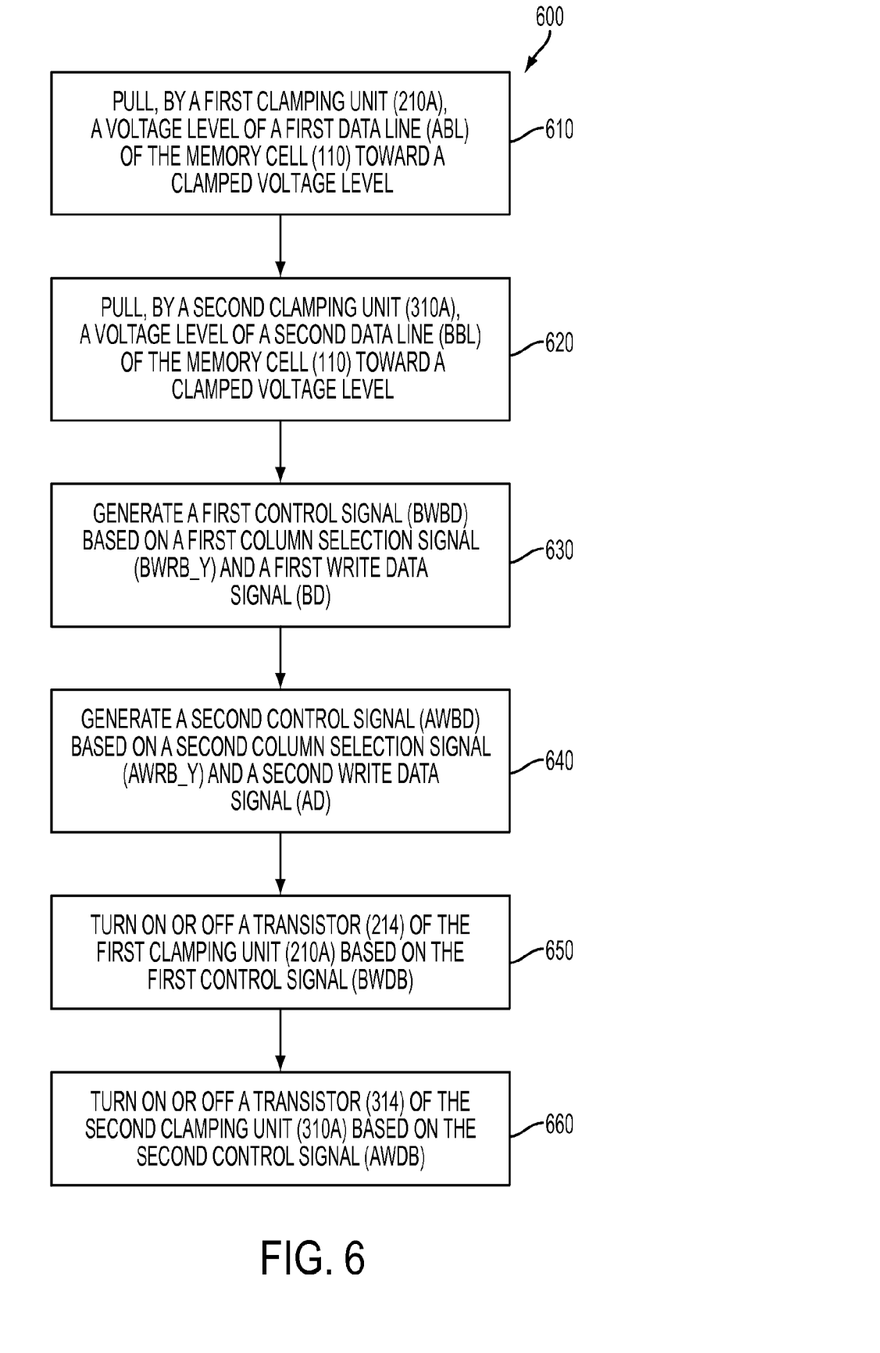
FIG. 6 is a flow chart of a method of operating a memory circuit in accordance with some embodiments.

FIG. 6 is a flow chart of a method 600 of operating a memory circuit, such as memory circuit 100 or memory circuit 500, in accordance with some embodiments. It is understood that additional operations may be performed before, during, and/or after the method 600 depicted in FIG. 6, and that some other processes may only be briefly described herein.

The process begins with operation 610, where a voltage level of data line ABL is pulled by clamping unit 210A toward a clamped voltage level, such as a power supply voltage level at power supply node 232. In operation 620, a voltage level of data line BBL is pulled by clamping unit 310A toward the clamped voltage level.

The process proceeds to operation 630, where a control signal BWDB is generated based on a write column selection signal BWRB_Y indicating that data line BBL is being selected for performing a write operation and a write data signal BD indicating a logic value to be written into memory cell 110 through data line BBL during the write operation.

In some embodiments, operation 630 includes generating control signal BWDB based on performing a NAND operation on write column selection signal BWRB_Y and write data signal BD. As a result, clamping unit 210A is electrically decoupled from data line ABL when write column selection signal BWRB_Y indicating that data line BBL is being selected for performing the write operation and write data signal BD indicating that a voltage level of data line BBL is being pulled toward a reference voltage level lower than the clamped voltage level during the write operation.

In operation 640, where a control signal AWDB is generated based on a write column selection signal AWRB_Y indicating that data line ABL is being selected for performing another write operation and a write data signal AD indicating a logic value to be written into memory cell 110 through data line ABL during the another write operation.

In some embodiments, operation 640 includes generating control signal AWDB based on performing a NAND operation on write column selection signal AWRB_Y and write data signal AD. As a result, clamping unit 310A is electrically decoupled from data line BBL when write column selection signal AWRB_Y indicating that data line ABL is being selected for performing a write operation and write data signal AD indicating that a voltage level of data line ABL is being pulled toward a reference voltage level lower than the clamped voltage level during the write operation.

The process proceeds to operation 650, where transistor 214 of clamping unit 210A is turned on or off based on control signal BWDB. In operation 660, transistor 314 of clamping unit 310A is turned on or off based on control signal AWDB.

In accordance with one embodiment, a circuit includes a memory cell, a first data line, a second data line, and a first clamping unit. The memory cell includes a data node, a first pass gate, and a second pass gate. The first pass gate and the second pass gate are controlled by different word line signals. The first pass gate is between the first data line and the data node of the memory cell. The second pass gate is between the second data line and the data node of the memory cell. The first clamping unit is electrically coupled to the first data line and configured to pull a voltage level of the first data line toward a clamped voltage level when the first clamping unit is enabled, and to function as an open circuit to the first data line when the first clamping unit is disabled. The first clamping unit is disabled when a first control signal indicates that a voltage level of the second data line is pulled toward a reference voltage level different from the clamped voltage level.

In accordance with another embodiment, a circuit includes a memory cell, a first data line, a second data line, a third data line, a fourth data line, a first clamping unit, and a second clamping unit. The memory cell includes a first node, a second node, a first pass gate, a second pass gate, a third pass gate, and a fourth pass gate. The first pass gate and the second pass gate are controlled by a first word line signal, and the third pass gate and the fourth pass gate are controlled by a second word line signal. The first pass gate is between the first data line and the first node of the memory cell. The second pass gate is between the second data line and the second node of the memory cell. The third pass gate is between the third data line and the first node of the memory cell. The fourth pass gate is between the fourth data line and the second node of the memory cell. The first clamping unit is configured to be electrically coupled to, or to be electrically decoupled from, the first data line based on a first write column selection signal and a first write data signal. The first write column selection signal indicates that the third data line is being selected for performing a write operation, and the first write data signal indicates a logic value for the write operation. The second clamping unit is configured to be electrically coupled to, or to be electrically decoupled from, the second data line based on the first write column selection signal and the first write data signal or based on the first write column selection signal and a first complementary write data signal. The first complementary write data signal indicates a complementary logic value for the write operation.

In accordance with another embodiment, a method includes pulling, by a first clamping unit, a voltage level of a first data line toward a clamped voltage level. The first data line is coupled to a data node of a memory cell through a first pass gate of the memory cell. The first clamping unit is electrically decoupled from the first data line when a first write column selection signal indicating that a second data line is being selected for performing a write operation and when a first write data signal indicating that a voltage level of the second data line is pulled toward a reference voltage level different from the clamped voltage level during the write operation. The second data line is coupled to the data node of the memory cell through a second pass gate of the memory cell, and the first and second pass gates are controlled by different word line signals.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a memory cell, comprising a data node, a first pass gate, and a second pass gate, the first pass gate and the second pass gate being controlled by different word line signals;
   a first data line, the first pass gate being between the first data line and the data node of the memory cell;
   a second data line, the second pass gate being between the second data line and the data node of the memory cell; and
   a first clamping unit electrically coupled to the first data line and configured to pull a voltage level of the first data line toward a clamped voltage level when the first clamping unit is enabled; and
      function as an open circuit to the first data line when the first clamping unit is disabled,
      the first clamping unit being disabled when a first control signal indicates that a voltage level of the second data line is pulled toward a reference voltage level different from the clamped voltage level.

2. The circuit of claim 1, wherein the first clamping unit comprises:
   a first transistor having a gate, a first terminal, and a second terminal; and
   a second transistor having a gate, a first terminal, and a second terminal, wherein the first terminal of the first transistor is coupled to a power supply node;
   the second terminal of the first transistor is coupled to the first terminal of the second transistor; and
   the second terminal of the second transistor is coupled to the first data line.

3. The circuit of claim 1, further comprising:
   a logic unit configured to generate the first control signal based on a write column selection signal and a write data signal, the write column selection signal indicating that the second data line is being selected for performing a write operation, and the write data signal indicating a logic value for the write operation.

4. The circuit of claim 3, wherein the logic unit comprises a NOR gate.

5. The circuit of claim 1, further comprising:
   a second clamping unit configured to
      pull the voltage level of the second data line toward the clamped voltage level when the second clamping unit is enabled; and
      function as an open circuit to the second data line when the second clamping unit is disabled,
      the second clamping unit being disabled when a second control signal indicates that the voltage level of the first data line is pulled toward the reference voltage level.

6. The circuit of claim 5, wherein the second clamping unit comprises:
   a first transistor having a gate, a first terminal, and a second terminal; and
   a second transistor having a gate, a first terminal, and a second terminal, wherein the first terminal of the first transistor is coupled to a power supply node;
   the second terminal of the first transistor is coupled to the first terminal of the second transistor; and
   the second terminal of the second transistor is coupled to the second data line.

7. The circuit of claim 5, further comprising:
   a logic unit configured to generate the second control signal based on a write column selection signal and a write data signal, the write column selection signal indicating that the first data line is being selected for performing a write operation, and the write data signal indicating a logic value for the write operation.

8. The circuit of claim 7, wherein the logic unit comprises a NOR gate.

9. The circuit of claim 1, wherein the memory cell is a static random access memory (SRAM) cell.

10. A circuit, comprising:
    a memory cell, comprising a first node, a second node, a first pass gate, a second pass gate, a third pass gate, and a fourth pass gate, the first pass gate and the second pass gate being controlled by a first word line signal, and the third pass gate and the fourth pass gate being controlled by a second word line signal;
    a first data line, the first pass gate being between the first data line and the first node of the memory cell;
    a second data line, the second pass gate being between the second data line and the second node of the memory cell;
    a third data line, the third pass gate being between the third data line and the first node of the memory cell;
    a fourth data line, the fourth pass gate being between the fourth data line and the second node of the memory cell;
    a first clamping unit configured to be electrically coupled to, or to be electrically decoupled from, the first data line based on a first write column selection signal and a first write data signal, the first write column selection signal indicating that the third data line is being selected for performing a write operation, and the first write data signal indicating a logic value for the write operation; and a second clamping unit configured to be electrically coupled to, or to be electrically decoupled from, the second data line based on the first write column selection signal and the first write data signal or based on the first write column selection signal and a first complementary write data signal, the first complementary write data signal indicating a complementary logic value for the write operation.

11. The circuit of claim 10, further comprising:

a first logic unit configured to generate a first control signal based on the first write column selection signal and the first write data signal, and the first clamping unit being controlled by the first control signal; and a second logic unit configured to generate a second control signal based on the first write column selection signal and the first complementary write data signal, and the second clamping unit being controlled by the second control signal.

12. The circuit of claim 11, wherein the first logic unit comprises a NOR gate, and the second logic unit comprises another NOR gate.

13. The circuit as claimed in claim 10, further comprising:

a third clamping unit configured to be electrically coupled to, or to be electrically decoupled from, the third data line based on a second write column selection signal and a second write data signal, the second write column selection signal indicating that the first data line is being selected for performing another write operation, and the second write data signal indicating a logic value for the another write operation; and a fourth clamping unit configured to be electrically coupled to, or to be electrically decoupled from, the fourth data line based on the second write column selection signal and the second write data signal or based on the second write column selection signal and a second complementary write data signal, the second complementary write data signal indicating a complementary logic value for the another write operation.

14. The circuit of claim 13, further comprising:

a first logic unit configured to generate a first control signal based on the second write column selection signal and the second write data signal, and the third clamping unit being controlled by the first control signal; and a second logic unit configured to generate a second control signal based on the second write column selection signal and the second complementary write data signal, and the fourth clamping unit being controlled by the second control signal.

15. The circuit of claim 14, wherein the first logic unit comprises a NOR gate, and the second logic unit comprises another NOR gate.

16. The circuit of claim 10, wherein the memory cell is a static random access memory (SRAM) cell.

17. A method, comprising:

pulling, by a first clamping unit, a voltage level of a first data line toward a clamped voltage level, the first data line being coupled to a data node of a memory cell through a first pass gate of the memory cell; and electrically decoupling the first clamping unit from the first data line when a first write column selection signal indicating that a second data line is being selected for performing a write operation and when a first write data signal indicating that a voltage level of the second data line is pulled toward a reference voltage level different from the clamped voltage level during the write operation, the second data line being coupled to the data node of the memory cell through a second pass gate of the memory cell, and the first and second pass gates being controlled by different word line signals.

18. The method of claim 17, wherein the electrically decoupled the first clamping unit from the first data line comprises:

generating a control signal based on performing a NOR operation on the first write column selection signal and the first write data signal; and turning off a transistor of the first clamping unit based on the control signal, thereby causing the first clamping unit to function as an open circuit to the first data line.

19. The method of claim 17, further comprising:

pulling, by a second clamping unit, the voltage level of the second data line toward the clamped voltage level; and electrically decoupling the second clamping unit from the second data line when a second write column selection signal indicating that the first data line is being selected for performing another write operation and when a second write data signal indicating that the voltage level of the first data line is pulled toward the reference voltage level.

20. The method of claim 19, wherein the electrically decoupled the second clamping unit from the second data line comprises:

generating a control signal based on performing a NOR operation on the second write column selection signal and the second write data signal; and turning off a transistor of the second clamping unit based on the control signal, thereby causing the second clamping unit to function as an open circuit to the second data line.

* * * * *